(12) United States Patent
Miao et al.

(10) Patent No.: US 11,163,326 B2
(45) Date of Patent: Nov. 2, 2021

(54) TEST SYSTEM AND TEST METHOD FOR A VOLTAGE REGULATOR WITH MULTI-MODE CONTROL

(71) Applicant: Chengdu Monolithic Power Systems Co., Ltd., Chengdu (CN)

(72) Inventors: Lei Miao, Hangzhou (CN); Long Li, Hangzhou (CN); Siran Wang, Hangzhou (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 101 days.

(21) Appl. No.: 16/748,527

(22) Filed: Jan. 21, 2020

(65) Prior Publication Data

US 2020/0233442 A1    Jul. 23, 2020

(30) Foreign Application Priority Data

Jan. 23, 2019    (CN) .......................... 201910064181.1

(51) Int. Cl.

| | |
|---|---|
| *G05F 1/575* | (2006.01) |
| *G01R 31/40* | (2020.01) |
| *G06F 1/26* | (2006.01) |
| *G05B 19/042* | (2006.01) |
| *G01R 19/165* | (2006.01) |

(52) U.S. Cl.
CPC .............. *G05F 1/575* (2013.01); *G01R 31/40* (2013.01); *G05B 19/0423* (2013.01); *G06F 1/26* (2013.01); *G01R 19/16538* (2013.01)

(58) Field of Classification Search
CPC ... G05F 1/575; G01R 31/40; G01R 19/16538; G06F 1/26; G05B 19/0423; Y02B 70/10; H02M 1/0035; H02M 1/0032; H02M 3/33569; H02M 3/33553
See application file for complete search history.

(56) References Cited

U.S. PATENT DOCUMENTS

2014/0107857 A1 * 4/2014 Yang ...................... G05F 1/575
                                                  700/298
2020/0007043 A1    1/2020 Miao

* cited by examiner

*Primary Examiner* — Farhana A Hoque
(74) *Attorney, Agent, or Firm* — Perkins Coie LLP

(57) ABSTRACT

A test method of a voltage regulator having a plurality of parameters that need to be set, the test method includes: receiving a user requirement on a computer; generating a plurality of setting combinations of the plurality of parameters, the plurality of parameters has different combination of values in different setting combinations; downloading the plurality of setting combinations to the voltage regulator via a first I/O bus and configuring the voltage regulator with each setting combination; configuring communication between a controller provided by the computer and measurement devices; executing the communication between the controller and the measurement devices via a second I/O bus; and displaying test result of each configured voltage regulator on the computer.

18 Claims, 9 Drawing Sheets

TEST SYSTEM AND TEST METHOD FOR A VOLTAGE REGULATOR WITH MULTI-MODE CONTROL

CROSS-REFERENCE TO RELATED APPLICATIONS

This application claims the benefit of Chinese application 201910064181.7, filed on Jan. 23, 2019, and incorporated herein by reference.

TECHNICAL FIELD

The present invention relates generally to voltage regulators with multi-mode control, and more particularly but not exclusively to test systems and test methods for voltage regulators with multi-mode control.

BACKGROUND

In power management, whether a load is light or high, a voltage regulator needs to have a high efficiency. For this purpose, the voltage regulator is designed to have multi-mode control for toggling between a light load mode and a high load mode, to improve the system efficiency at both light load and high load.

As the technology develops, more and more operational parameters (e.g., skip mode level, burst mode level, ultra-low power mode level) used in the multi-mode control of the voltage regulator are set to correspond different working modes. In applications, the performance of the multi-mode voltage regulator is greatly influenced by values of these operational parameters. The manual configuration of these operational parameters is typically requires electrical engineers with experience in power management and in using the particular integrated circuit (IC). However, it is still hard for complex multi-mode control since these operational parameters have interconnections but influence each other. In some circumstances, small change of one operational parameter may greatly change other operational parameters, and may cause the performance of the multi-mode voltage regulator worse. Some users may encounter some difficulties while setting a plurality of the operational parameters to the multi-mode voltage regulator. However, it might not be possible to completely rely on the electrical engineers from voltage regulator vendors because the number of the experienced electrical engineers is limited and not enough to support numerous users.

In addition, in a traditional test method, after every time manual configuration or calibration of the operational parameters for the multi-mode voltage regulator, test engineers have to connect the configured voltage regulator to lots of measurement devices before every test execution and record the test results after every test completion, which is unduly laborious and time-consuming and thus low efficiency.

SUMMARY

Embodiments of the present invention are directed to a test method of a voltage regulator, wherein the voltage regulator has a plurality of parameters that need to be set, the test method comprising: receiving a user requirement for the voltage regulator on a computer, automatically generating a plurality of setting combinations of the plurality of parameters, wherein the plurality of parameters has different combination of values in different setting combinations, downloading the plurality of setting combinations to the voltage regulator via a first input/output (I/O) bus and configuring the voltage regulator with each setting combination, configuring communication between a controller provided by the computer and measurement devices coupled to the voltage regulator to meet the user requirement, executing the communication between the controller and the measurement devices via a second I/O bus, and displaying test result of each configured voltage regulator on the computer.

BRIEF DESCRIPTION OF THE DRAWING

Non-limiting and non-exhaustive embodiments are described with reference to the following drawings.

The use of the same reference label in different drawings indicates the same or like components.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
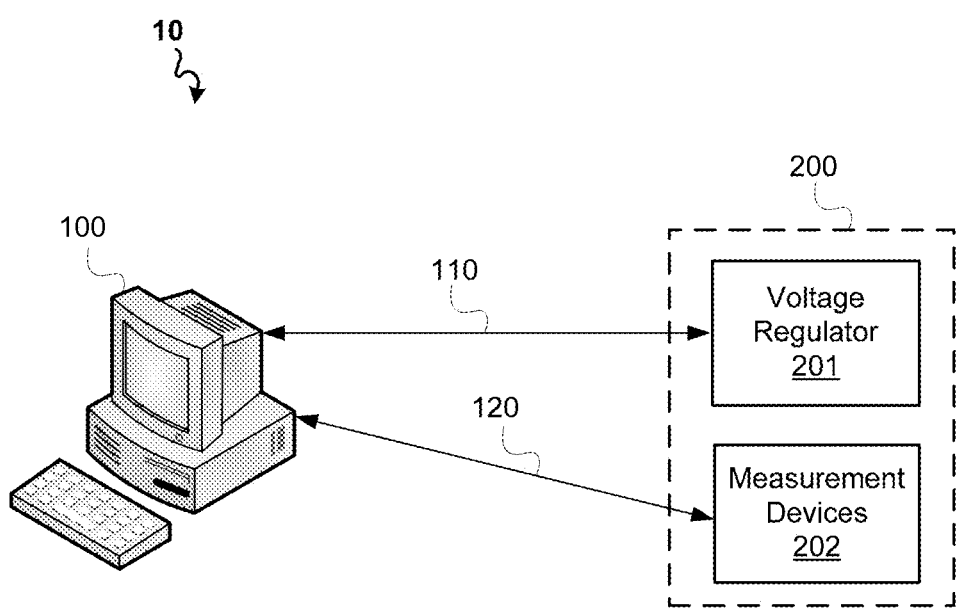
FIG. 1 schematically illustrates a test system 10 for a voltage regulator with multi-mode control in accordance with an embodiment of the present invention.

FIG. 1 schematically illustrates a test system 10 for a voltage regulator with multi-mode control in accordance with an embodiment of the present invention. In the example of FIG. 1, the test system 10 comprises a computer 100, a voltage regulator 201 connected to the computer 100 via a first I/O bus 110, and one or more measurement instruments 202 connected to the computer 100 via a second I/O bus 120. The computer 100 may be employed by a user, who is typically an electrical engineer, to test the voltage regulator 201 to meet particular user requirements. The voltage regulator 201 has a plurality of parameters that need to be set. The measurement devices 202 and the voltage regulator 201 may be installed in a circuit board via fixers, to form an auto-test platform 200.

The computer 100 includes a processor, one or more data storage devices, a display monitor, and one or more user input devices such as a keyboard or mouse. The computer 100 may be connected to the measurement devices 202 to analyze, measure or control the operation of the voltage regulator 201. In detail, the computer 100 receives a user requirement for the voltage regulator 201, automatically generates a plurality of setting combinations of the plurality of parameters, wherein the plurality of parameters has different combination of values in different setting combinations. The computer 100 further configures communication between a controller provided by the computer 100 and measurement devices 202 coupled to the voltage regulator 201 to meet the user requirement. In one embodiment, the user requirement comprises changing an input voltage of voltage regulator 201 within a specified range.

The voltage regulator 201 downloads the plurality of setting combinations via the first I/O bus 110 for configuring the voltage regulator 201 with each setting combination. In one embodiment, the voltage regulator 201 may be coupled to an I/O bus interface of the computer 100 via the first I/O bus 110. The I/O bus interface converts USB communications to I2C bus communications or PMBUS communication supported by the voltage regulator 201.

The measurement devices 202 communicates with the controller of the computer 100 via the second I/O bus 120. The controller sends control instructions to operate the measurement devices 202, receives and displays test result of each configured voltage regulator 201 while operating the measurement devices 202 in accordance with the control instructions. In one embodiment, the measurement devices 202 include programmable power supplies, programmable loads, data acquisition devices, smart sensors, and any of various types of devices that are operable to acquire and/or store data. The measurement devices 202 may also optionally be further operable to analyze or process the acquired or stored data, and be further operable to perform control functions. For example, the measurement devices 202 may send a control signal to an external system or to a sensor, in response to particular data. The measurement devices 202 may also be operable to perform automation functions, i.e., may receive and analyze real-time current signal or voltage signals of the voltage regulator 201 and so on.

In one embodiment, the second I/O bus 120 comprises a general purpose interface bus (GPIB). The measurement devices 202 coupled to a GPIB interface card that works as the controller of the computer 100.

Figure 2:
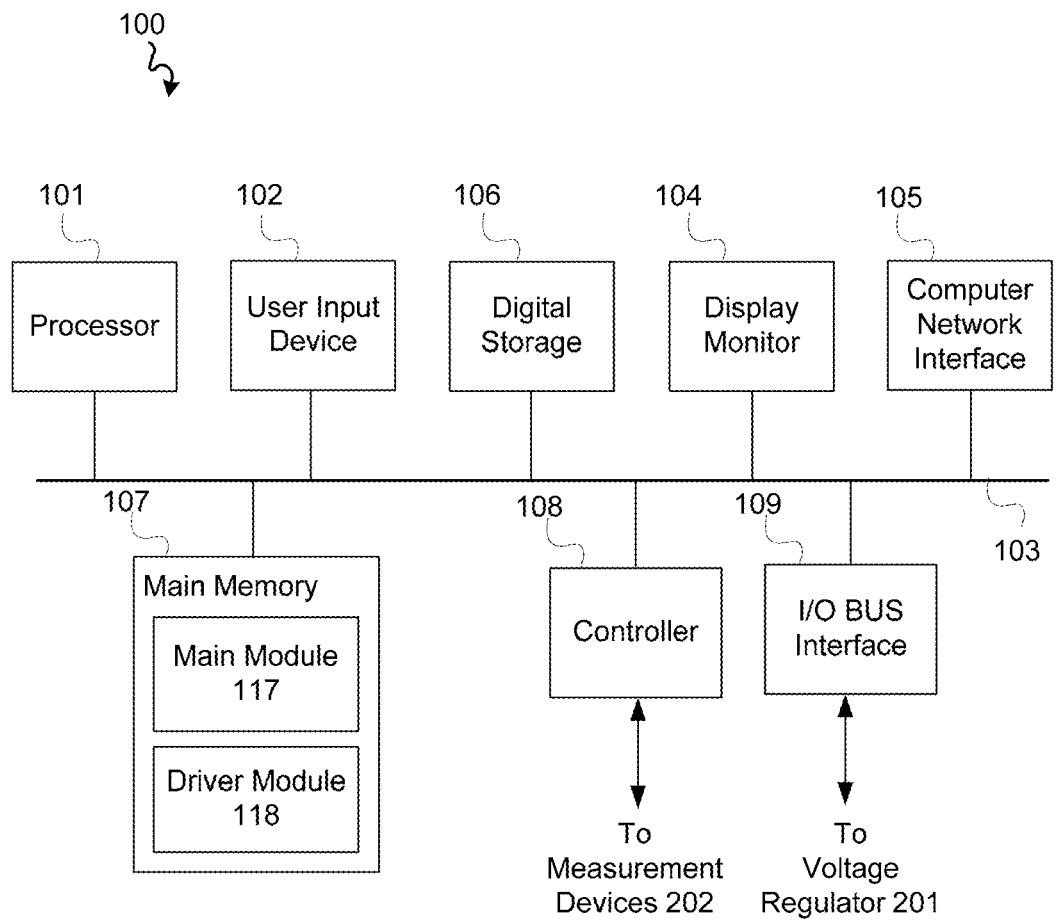
FIG. 2 schematically illustrates a block diagram of a computer 100 used in the test system 10 of FIG. 1 in accordance with an embodiment of the present invention.

FIG. 2 schematically illustrates a block diagram of a computer 100 used in the test system 10 of FIG. 1 in accordance with an embodiment of the present invention. The computer 100 may have fewer or more components without detracting from the merits of the present invention.

In the example of FIG. 2, the computer 100 comprises a processor 101 and one or more buses 103 coupling its various components. The computer 100 may include one or more user input devices 102 (e.g., keyboard, mouse), one or more data storage devices 106 (e.g., hard drive, optical disk, Universal Serial Bus memory), a display monitor 104, a computer network interface 105, and a main memory 107 (e.g., random access memory). The computer network interface 105 may be coupled to a computer network.

In the example of FIG. 2, the computer 100 further includes a controller 108 and an I/O bus interface 109. The controller 108 may comprise a GPIB interface card. The I/O bus interface 108 may comprise a universal serial bus (USB) interface, for example. The voltage regulator 201 is coupled to the computer 100 through the I/O bus interface 109.

In the example of FIG. 2, the measurement devices 202 is coupled to the controller 108 via the second I/O bus 120. The controller 108 communicates with the measurement devices 202 to meet the user requirement. The communication between the controller 108 and the measurement devices 202 comprises sending control instructions to operate the measurement devices 202 and receiving returned formatted data and response data of the each configured voltage regulator to the controller 108 while operating the measurement devices 202 in accordance with the control instructions.

The computer 100 is a particular machine as programmed with software modules stored non-transitory in the main memory 107 for execution by the processor 101. The term "software module" is intended to have the full breadth of its ordinary meaning, and includes any type of program instructions, code, script and/or data, or combinations thereof, that may be stored in a memory medium and executed by a processor. Exemplary software modules include programs written in text-based programming languages, such as C, C++, PASCAL, FORTRAN, COBOL, JAVA, assembly language, etc.; graphical programs (programs written in graphical programming languages); and other types of executable software.

In the example of FIG. 2, the computer 100 comprises a main module 117 with a first computer program and a driver module 118 with a second computer program. In one embodiment, the second computer program comprises LabVIEW. The aforementioned software modules 117 and 118 comprise computer-readable program code stored non-transitory in the main memory 107 for execution by the processor 101. The software modules 117 and 118 may be loaded from the data storage device 106 to the main memory 107.

Figure 3:
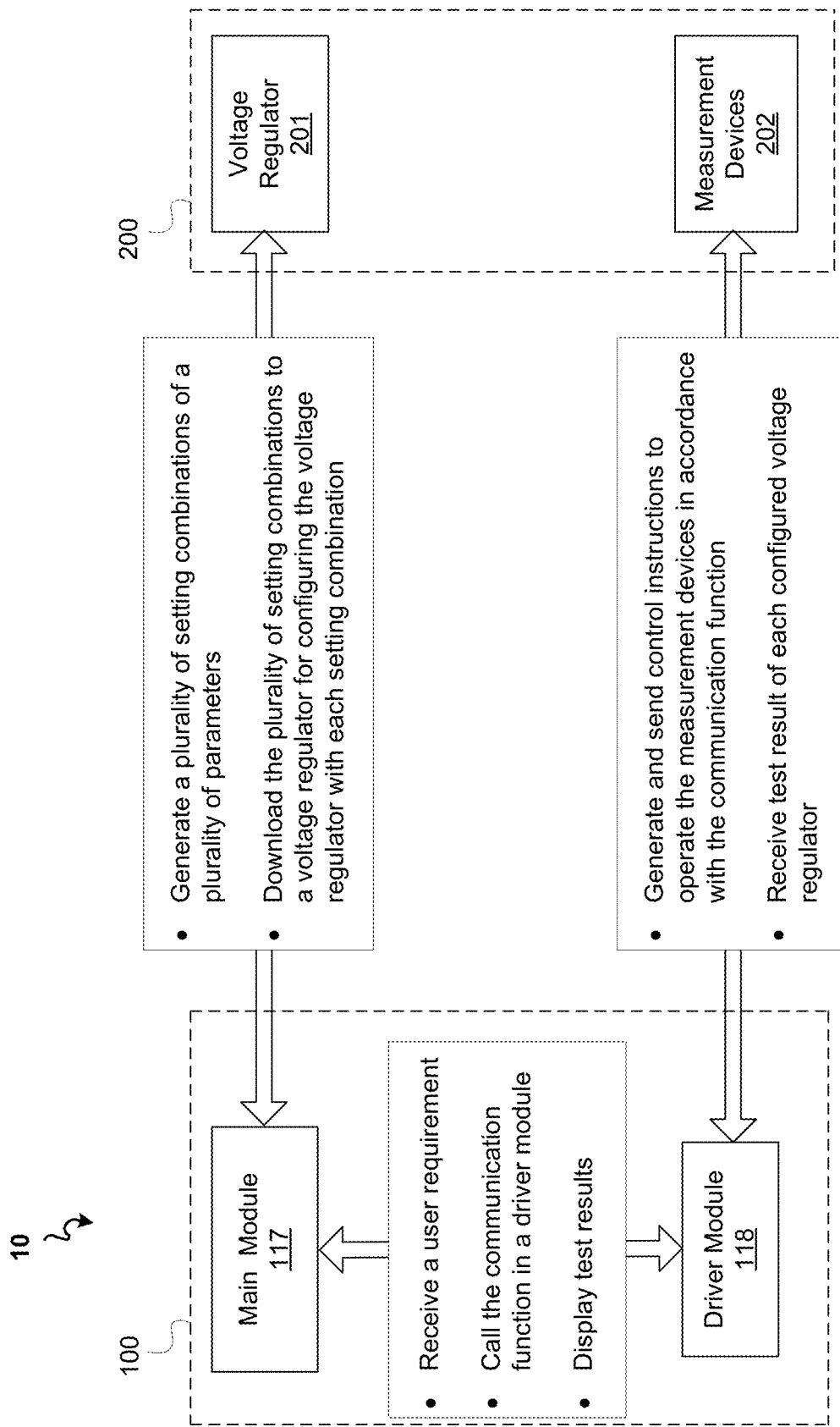
FIG. 3 schematically illustrates a block diagram of the test system 10 in accordance with an embodiment of the present invention.

Several of the details of the embodiments described below with reference to FIGS. 3-6. FIG. 3 schematically illustrates a block diagram of the test system 10 in accordance with an embodiment of the present invention. In the example of FIG. 3, the test system 10 comprises a computer 100, a voltage regulator 201 and one or more measurement devices 202. Wherein the voltage regulator 201 and the measurement devices 202 are installed in a circuit board, to make an auto-test platform 200. The voltage regulator 201 has a plurality of parameters that need to be set.

As shown in FIG. 3, the computer 100 comprises a maim module 117 and a driver module 118. In the example of FIG. 3, the driver module 118 communicates with the measurement devices 202 through the controller 108 to control the automated operation of the measurement devices 202. In other words, the driver module 118 is configured to process the data transfer between the controller 108 and the measurement devices 202, via the second I/O bus 120. The data transfer comprises the control instructions to operate the measurement devices 202 and test results. In one embodiment, the controller 108 comprises a GPIB interface card. The driver module 118 comprises a GPIB driver level having communication function module integrated in a software LabVIEW.

In the example of FIG. 3, the main module 117 receives a user requirement and automatically generates a plurality of setting combinations of the plurality of parameters, wherein the plurality of parameters has different combination of values in different setting combinations. The main module 117 communicates with the voltage regulator 201 via the first I/O bus 110, downloads the plurality of setting combinations to the voltage regulator 201 and configures the voltage regulator 201 with each setting combination.

In one embodiment, the user requirement comprises changing a load of the voltage regulator 201 from no-load to full-load. In another embodiment, the user requirement comprises changing the input voltage of voltage regulator 201 within a specified range. To meet the user requirement, the main module 117 calls communication function of the driver module 118 and generates control instructions to operate the measurement devices 202 in accordance with the communication function of the driver module 118. The measurement devices 202 receive the control instructions from the controller 108, executes the control instructions and returns test result of each configured voltage regulator to the computer 100 for displaying.

Figure 4:
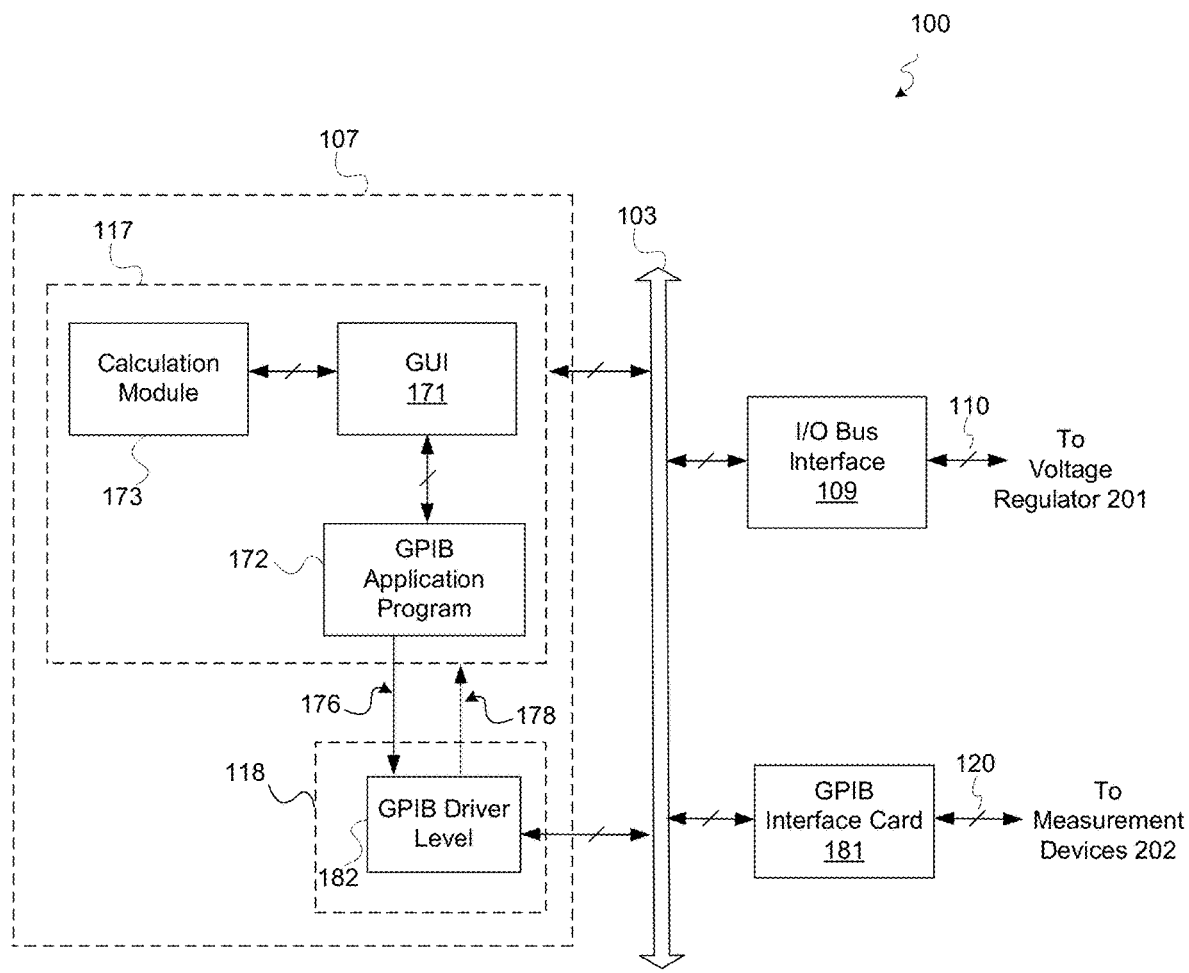
FIG. 4 illustrates a block diagram of the computer 100 in accordance with another embodiment of the present invention.

FIG. 4 illustrates a block diagram of the computer 100 in accordance with another embodiment of the present invention. As shown in FIG. 4, the computer 100 comprises a processor 101 and one or more buses 103 coupling to a main memory 107, a I/O bus interface 109 and a GPIB interface card 181 as a controller. In the example of FIG. 4, computer-readable program code stored in the main memory 107 comprises a main module 117 and a driver module 118. The main module 117 comprises a graphical user interface (GUI) 171, a GPIB application program 172 and a calculation module 173. The driver module 118 comprises GPIB driver level 181.

The main module 117 receives user interface events in the GUI 171, e.g., mouse clicks, mouse movements, text entry, etc., to provide a user requirement. In one embodiment, the user requirement comprises providing all possible setting combinations of a plurality of parameters for configuring a voltage regulator 201. The voltage regulator 201 has a plurality of parameters that need to be set. In another embodiment, the user requirement comprises testing efficiency of configured voltage regulator 201 between no-load and full-load. A GUI 171 may comprise a single window having one or more GUI elements, or may comprise a plurality of individual GUI elements (or individual windows each having one or more GUI elements), wherein the individual GUI Elements or windows may optionally be tiles together. The GUI element provides input or displays output and comprises displaying the inputted data and calculation result of the calculation module 173.

As shown FIG. 4, the calculation module 173 communicates with the GUI 171 to receive a first subset of the plurality of parameters for the voltage regulator 201, calculates a second subset of the plurality of parameters based a preset relational data model and the first subset, and combines the first subset and second subset to generate the plurality of setting combinations of the plurality of parameters. The preset relational data model may comprise equations, inequality, table data or other preset relation. In one embodiment, the first subset comprises a first parameter range and a second parameter range, the second subset comprises a third parameter range and a fourth parameter range, the plurality of parameters has different combination of values in different setting combinations.

In one embodiment, the GUI 171 has a first GUI element that receives the first parameter range and the second parameter range, a second GUI element configured to set step of each of the plurality of parameters, and a third GUI element that displays the third parameter range and the fourth parameter range after calculation of the calculation module 173.

After the plurality of the setting combination of the plurality of parameters is ready, the voltage regulator 201 downloads the plurality of setting combinations via the first I/O bus 110 for configuring the voltage regulator 201 with each setting combination. In one embodiment, the calculation module 173 stores the plurality of the setting combinations of the plurality of parameters in the main memory 107, then the plurality of the setting combinations is downloaded to the voltage regulator 201.

As shown in FIG. 4, the GPIB application program 172 communicates with the GUI 171, receives the user requirement, such as load change or input voltage change, and makes a corresponding call (see arrow 176) to communication function of the GPIB driver level 182. The GPIB driver level 182 responds the call from the GPIB application program 172, executes the communication function to the GPIB interface card 181. The communication function comprises writing date from the GPIB interface card 181 to a storage unit of the measurement devices 202, e.g., sending the control instructions to operate the measurement devices 202, or reading back data pack from the storage unit of the measurement devices 202 to the GPIB interface card 181, e.g., reading back the test result of each configured voltage regulator 201. The GPIB driver module 182 collected the test result and returns them to the main module 117 for displaying on the GUI 171 (see arrow 178).

The main module 117 may provide performance curves the configured voltage regulator 201 in accordance with the test results including the digital value of an output voltage, load current or frequency. In one embodiment, the performance curves are displayed in a chart of the GUI 171. In this way, user can easily identify the optimum performance curve and finding out the corresponding values of the plurality of parameters. Thereafter, the setting combination of the plurality of parameters are downloaded to a configuration register of the voltage regulator 201. The voltage regulator 201 is then installed in the application environment, which may be the end product.

In one embodiment, there is no need to code the driver module 118, an alternative embodiment is to call the communication function in the GPIB driver level integrated in LabVIEW.

Figure 5:
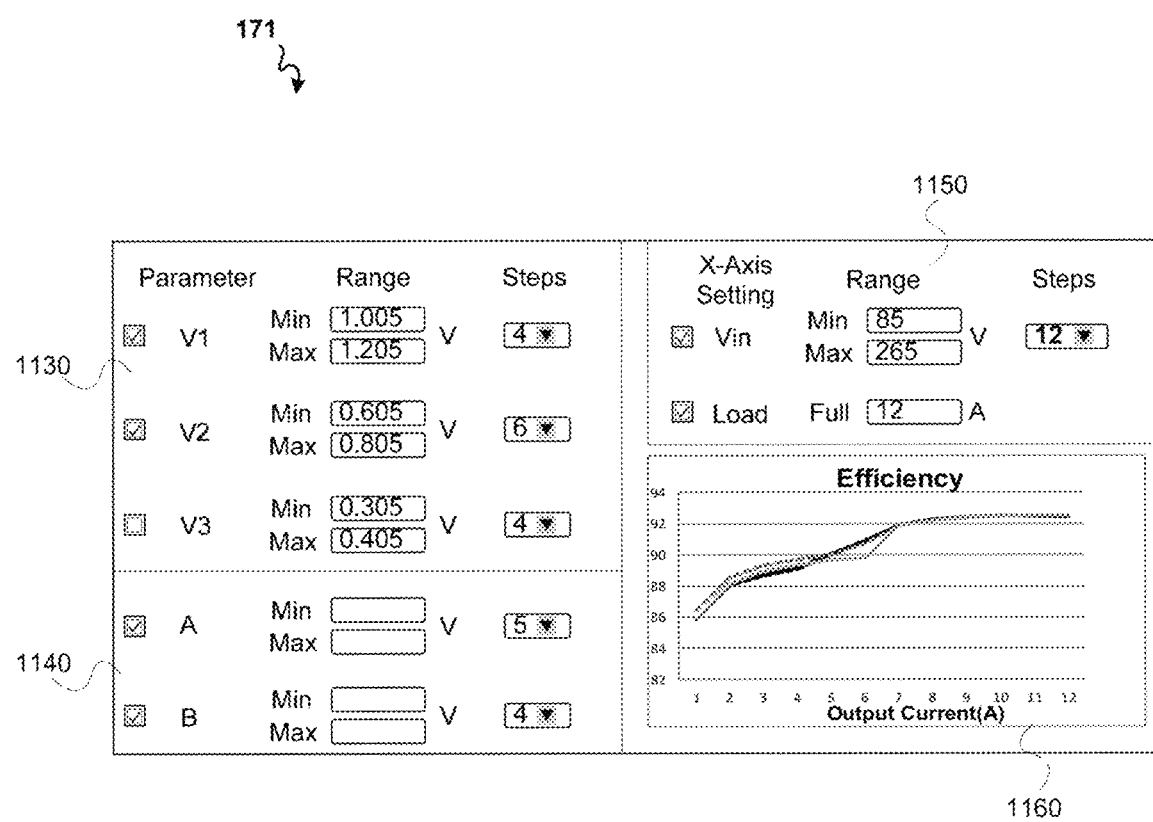
FIG. 5 illustrates a window of the GUI 171 displaying the computer 100 in accordance with an embodiment of the present invention.

FIG. 5 illustrates a window of the GUI 171 displaying the computer 100 in accordance with an embodiment of the present invention. In the example of FIG. 5, the voltage regulator 201 has five parameters that need to be set. The five parameters includes a skip mode level V1, a burst mode level V2, an ultra-low power mode level V3, a proportional coefficient A and an offset value B. Wherein the first subset of the five parameters comprises a set of the skip mode level V1 ($\{V1(k), i=1, 2, \ldots K\}$); a set of the burst mode level V2 ($\{V2(m), i=1, 2, \ldots M\}$); and a set of the ultra-low power mode level V3 ($\{V3(j), i=1, 2, \ldots J\}$); the second subset of the five parameters comprises a set of the proportional coefficient setting A ({A(n), i=1, 2, ... N}); and a set of the offset value B ({B(l), i=1, 2, ... L}). Wherein K, M, J, N and L are all integers.

As shown in FIG. 5, the window of the GUI 171 has GUI elements 1120~1160. The GUI element 1120 receives a range of the skip mode level V1, a range of the burst mode level V2 and a range of the ultra-low power mode level V3. The GUI element 1130 is configured to set step of each of the parameters V1-V3, A and B. The GUI element 1140 will display a range of the proportional coefficient A and a range of the offset value B after calculation of the calculation module 173. In one embodiment, the user can select one or more parameters with the checking box.

In the example of FIG. 5, the calculation module 173 shown in FIG. 4 combines the first subset and the second subset to generate setting combinations with the number of K*M*N*L. Each setting combination comprises the parameters V1, V2, A and B. The parameters V1, V2, A and B have different combination of values in different setting combinations.

As shown in FIG. 5, the GUI element 1150 is configured to receive a load range, an input voltage range and the step for input voltage change. The GUI element 1160 is configured to display the test result of each configured voltage regulator, for example, the efficiency curves.

Figure 6:
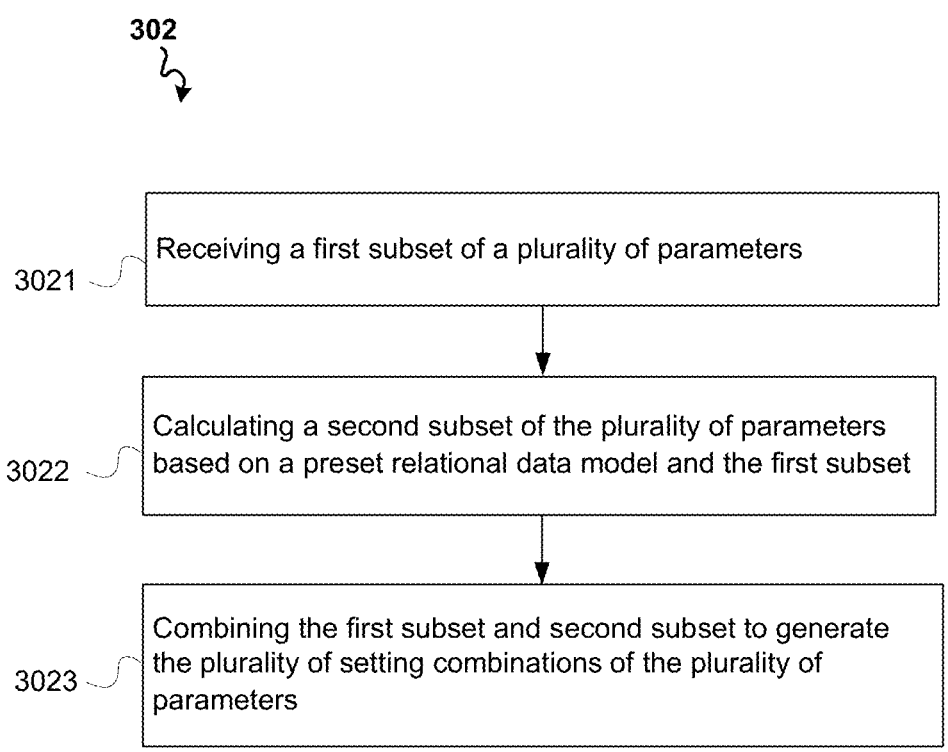
FIG. 6 illustrates a flow diagram of a method 302 of generating a plurality of setting combinations of a plurality of parameters for a voltage regulator 201 in accordance with an embodiment of the present invention.

FIG. 6 illustrates a flow diagram of a method 302 of generating a plurality of setting combinations of a plurality of parameters for a voltage regulator 201 in accordance with an embodiment of the present invention. The method 302 comprises steps 3021~3023.

In step 3021, a first subset of the plurality of parameters including a first parameter range and a second parameter range are received.

In step 3022, a second subset of the plurality of parameters including a third parameter range and a fourth parameter range are calculated based on a preset relational data model and the first subset.

In the step 3033, the first subset and the second subset of the plurality of parameters are combined to generate the plurality of setting combinations of the plurality of parameters.

Figure 7:
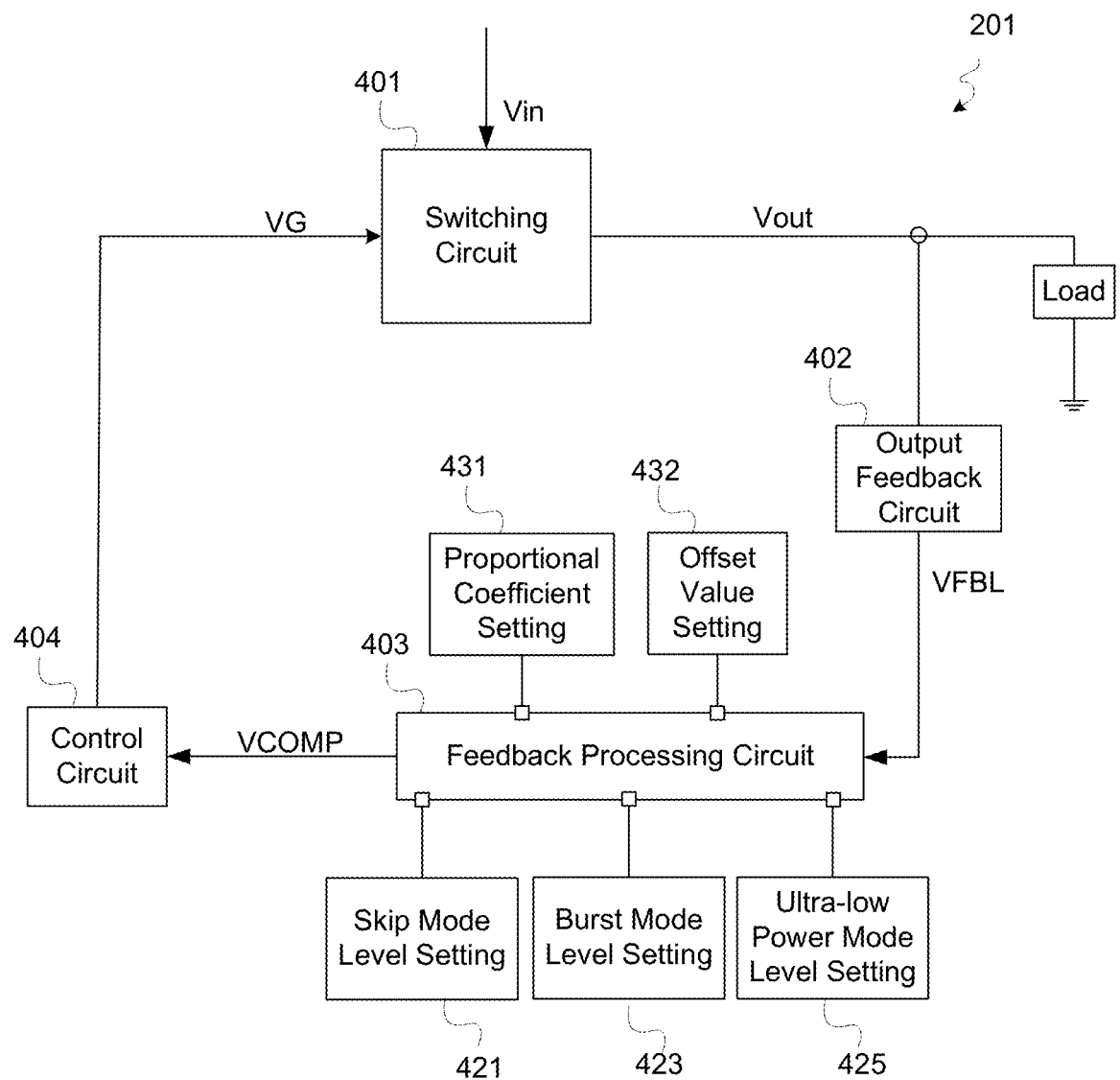
FIG. 7 illustrates a schematic diagram of a voltage regulator 201 with multi-mode control in accordance with an embodiment of the present invention.

FIG. 7 illustrates a schematic diagram of a voltage regulator 201 with multi-mode control in accordance with an embodiment of the present invention. The voltage regulator has five parameters that need to be set. The five parameters comprise a skip mode level V1, a burst mode level V2, an ultra-low power mode level V3, a proportional coefficient A and an offset value B.

In the example of FIG. 7, the voltage regulator 201 comprises a switching circuit 401, an output feedback circuit 402, a feedback processing circuit 403 and a control circuit 404. The switching circuit 401 receives an input voltage Vin and provides an output voltage Vout via controlling at least a switch.

The output feedback circuit 402 is configured to generate a feedback voltage signal VFBL based on the output voltage Vout. In some embodiments, the output feedback circuit 105 includes a voltage divider coupled to the output voltage Vout, and an error amplifying circuit which proportionally integrates the error between the signal generated by the voltage divider and a reference voltage. In some other embodiments, the output feedback circuit 402 utilizes a conventional three-terminal regulator and an impedance network to obtain the feedback voltage signal VFBL.

As shown in FIG. 7, The feedback processing circuit 403 processes the feedback voltage signal VFBL to generate the output feedback signal VCOMP. In the example of FIG. 7, the voltage regulator 201 works with multi-mode, the feedback processing circuit 403 further has a skip mode level setting 421 for the skip mode level V1, a burst mode level setting 423 for the burst mode level V2, an ultra-low power mode level setting 425 for the ultra-low power mode level V3, a proportional coefficient setting 431 for proportional coefficient A, and an offset value setting 432 for the offset value B. The control circuit 404 generates a control signal VG to control the at least a switch of the switching circuit 401.

Figure 8:
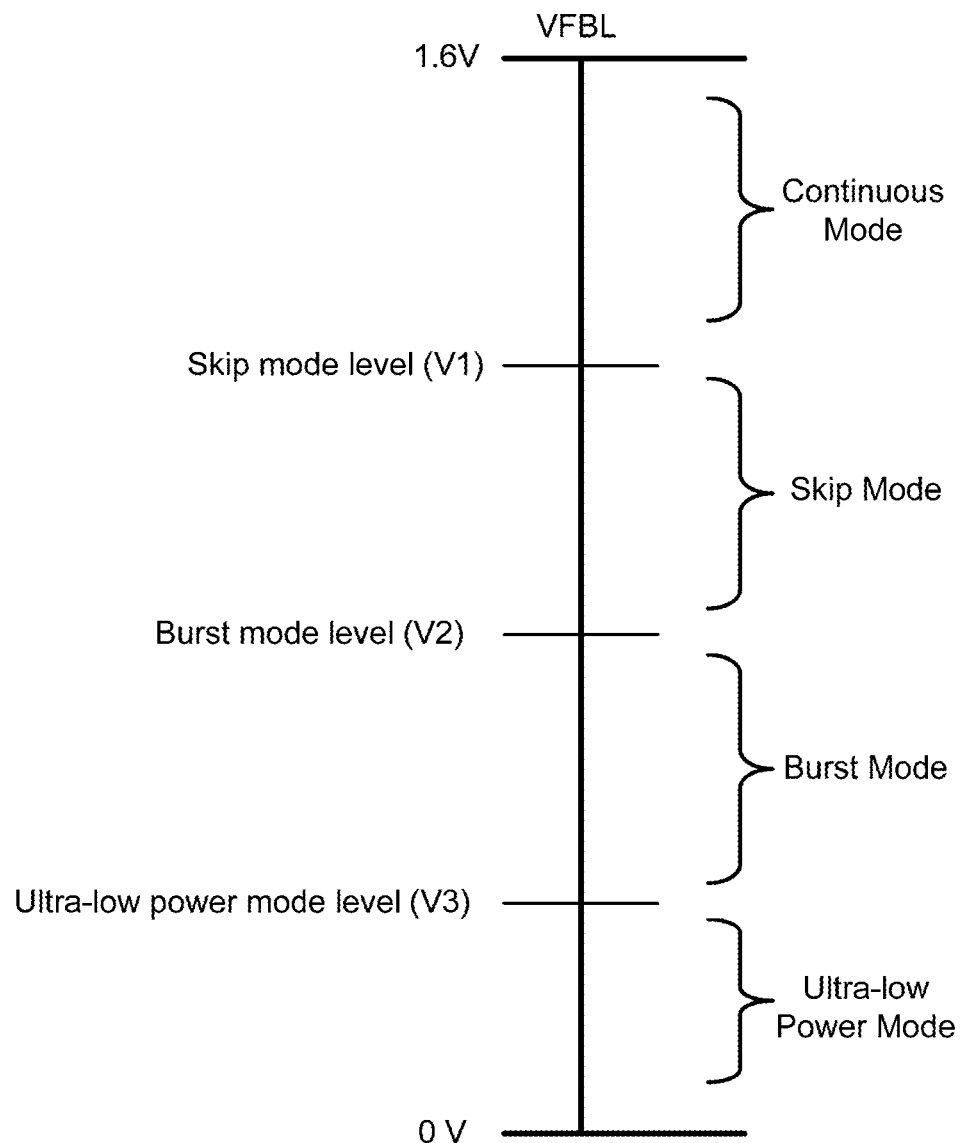
FIG. 8 defines the working modes of the voltage regulator 201 by monitoring a feedback voltage VFBL in accordance with an embodiment of the present invention.

FIG. 8 defines the working modes of the voltage regulator 201 by monitoring a feedback voltage VFBL in accordance with an embodiment of the present invention. As shown in FIG. 8, the voltage regulator 201 has four working modes including a continuous mode, a skip mode, a burst mode and an ultra-low power mode. The feedback processing circuit 403 monitors the value of the feedback voltage signal VFBL and determines the working mode of the voltage regulator 201.

In the example of FIG. 8, the feedback voltage signal VFBL varies between 0V and 1.6V. It is to be understood that this value range is for illustration purposes and not limiting. Many alternative embodiments will be apparent to persons of ordinary skill in the art reading this disclosure.

As shown in FIG. 8, when the feedback voltage signal VFBL keeps higher than the skip mode level V1, the voltage regulator 201 works in the continuous mode. During the continuous mode, the feedback voltage signal VFBL is directly used as the output feedback signal VCOMP by adding a fixed offset voltage. In one embodiment, the feedback processing circuit 403 generates the output feedback signal VCOMP can be expressed as VCOMP=VFBL−VCONST. Wherein VCONST is a constant, for example, 1V.

When the feedback voltage signal VFBL decreases to less than the skip mode level V1, the working mode of the voltage regulator 201 switches from the continuous mode to a skip mode. When the feedback voltage signal VFBL increases to higher than the skip mode level V1, the voltage regulator 201 enters the continuous mode and exits the skip mode.

Similarly, when the feedback voltage signal VFBL decreases to less than the burst mode level V2, the working mode of the voltage regulator 201 switches from the skip mode to the burst mode. When the feedback voltage signal VFBL increases to higher than the burst mode level V2, the voltage regulator 201 enters the skip mode and exits the burst mode.

During skip mode or burst mode, the feedback voltage signal VFBL is internally processed to the output feedback signal VCOMP. In one embodiment, VCOMP=A*VFBL+B, wherein A is proportional coefficient and B is offset value. In one embodiment, the proportional coefficient A and the offset value B should meet the relational data inequality: A*V1+B>V1−1 and the 1>A*V2+B>V2−1. Such relational data inequality can be used in the calculation module 173 of the computer 100 shown in FIG. 4.

In one further embodiment, when the feedback voltage signal VFBL decreases to less than the ultra-low power mode level V3, the working mode of the voltage regulator 201 switches from burst mode to the ultra-low power mode. When the feedback voltage signal VFBL increases to higher than the ultra-low power mode level V3, the voltage regulator 201 enters burst mode and exits the ultra-low power mode. In one embodiment, the ultra-low power mode level V3 is higher than 0.1V.

Figure 9:
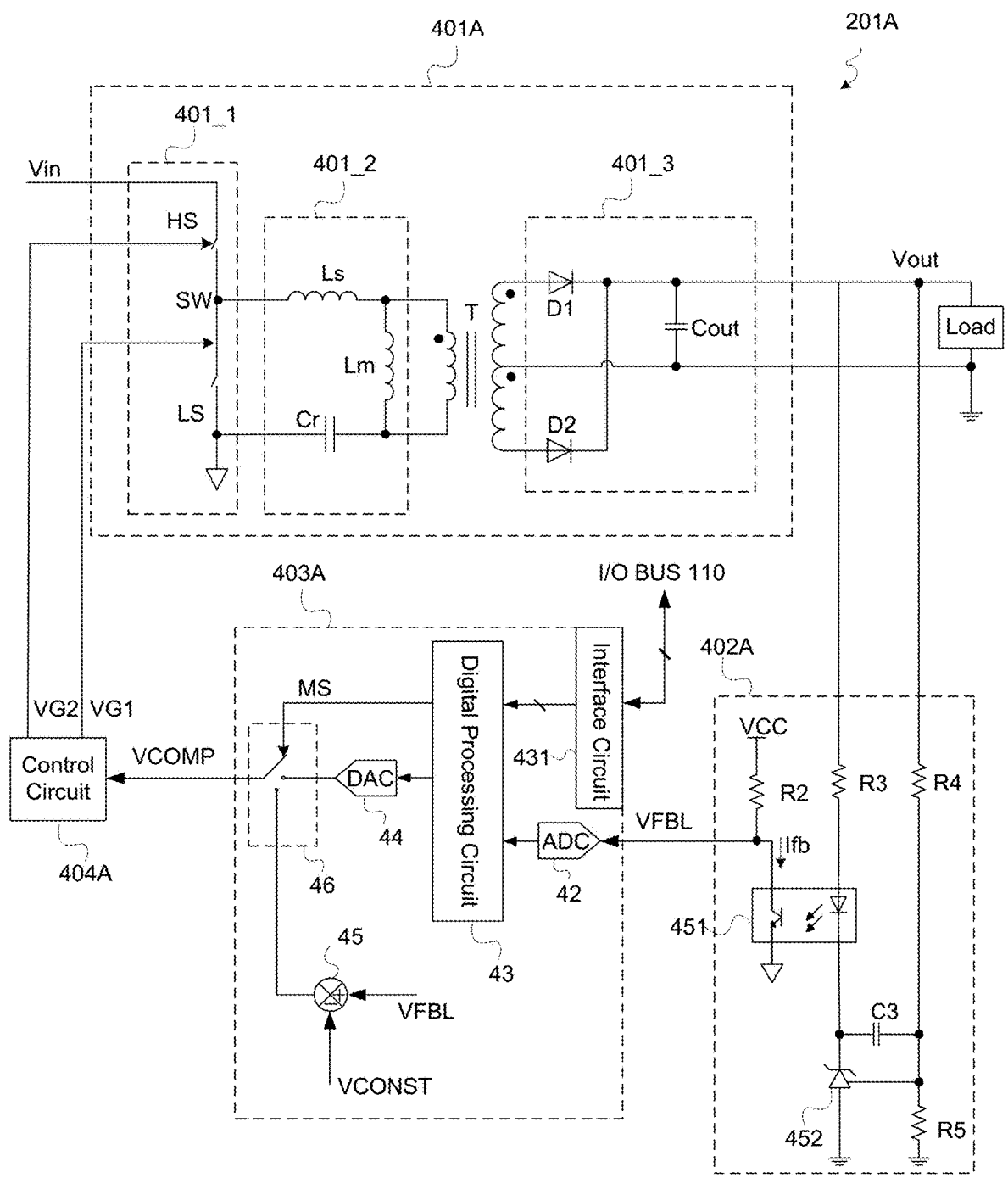
FIG. 9 illustrates a block diagram of a voltage regulator 201A in accordance with another embodiment of the present invention.

FIG. 9 illustrates a block diagram of a voltage regulator 201A in accordance with another embodiment of the present invention. The voltage regulator 201A has a plurality of parameters that need to be set. In the example of FIG. 9, the voltage regulator 201A comprises a switching circuit 401A, an output feedback circuit 402A, a feedback processing circuit 403A and a control circuit 404. The switching circuit 401A comprises a pair of switches 401_1, a resonant circuit 401_2, a transformer T and a rectifying and filtering circuit 401_3. The pair of switches 401_1 includes a high side transistor HS coupled between an input voltage Vin and a switch node SW, and a low side transistor LS coupled between the switch node SW and a reference ground. The resonant circuit 401_2 is coupled to the switch node SW, and includes an LLC circuit consisting of a capacitor Cr and inductors Ls, Lm.

The primary winding of the transformer T is coupled to the resonant circuit 401_2. The rectifying and filtering circuit 401_3, which includes diodes D1, D2 and a capacitor Cout, rectifies and filters the voltage across the secondary winding of the transformer T, so as to provide an output voltage Vout to a load.

The output feedback circuit 402A is configured to generate a feedback voltage signal VFBL at an output terminal based on the output voltage Vout. The output feedback circuit 402A comprises a photo coupler 451, a three-terminal regulator 452, resistors R2~R5, and a capacitor C3. A current Ifb flowing through the photosensitive element in the photo coupler 451 is generated based on the output voltage Vout, and then converted into the feedback voltage signal VFBL through the resistor R2.

The feedback processing circuit 403A is coupled to the output terminal of the feedback circuit 402A to receive the feedback voltage signal VFBL, monitors and processes the feedback voltage signal VFBL, and generates an output feedback signal VCOMP corresponding to a current working mode of the voltage regulator 201A. In the example of FIG. 9, the feedback processing circuit 403A comprises an interface circuit 41, an analog digital converter (ADC) 42, a digital processing circuit 43, a digital analog converter (DAC) 44, a subtracting circuit 45 and a selection circuit 46. In one embodiment, the interface circuit 41 communicates with the first I/O bus 110 shown in FIGS. 1 and 3 to receive a dada pack of the plurality of the setting combinations of the plurality of parameters from the computer 100.

The feedback processing circuit 403A downloads the plurality of setting combinations in the interface circuit 41, and configures the interface circuit 41 with each setting combination by setting the values the plurality of parameters of the voltage regulator in accordance with the combination of values of each setting combination.

In the example of FIG. 9, the interface circuit 41 receives the plurality of setting combinations of the plurality of the parameters and transfers the combination of values of each setting combination to the digital processing circuit 43 for processing. The ADC 42 receives the feedback voltage signal VFBL and outputs a digital feedback voltage signal VFBL to the digital processing circuit 43. The digital processing circuit 43 is coupled to the interface circuit 41 to receive the plurality of setting combination, and is coupled to the ADC 42 to receive the digital feedback voltage signal VFBL. The digital processing circuit 43 monitors the digital feedback voltage signal VFBL, determines the working mode of the voltage regulator 201A by comparing the digital feedback voltage signal VFBL with different levels of different working modes, and generated a mode control signal MS to control the selection circuit 46. In one embodiment, the digital processing circuit 43 compares the digital feedback voltage VFBL with a skip mode level V1, a burst mode level V2 and an ultra-low power mode level V3 and determines the working mode of the voltage regulator 201A. In one embodiment, when the feedback voltage signal VFBL is higher than the skip mode level V1, the voltage regulator 201A works in the continuous mode, the mode control signal MS has a first level. When the feedback voltage signal VFBL is less than the skip mode level V1, the voltage regulator 201A works in the skip mode or burst mode, the mode control signal MS has a second level. In addition, the digital processing circuit 43 provides a digital output signal VCOPM2. In one embodiment, during the skip mode or burst mode, the digital output signal VCOMP2=A*VFBL+B. wherein A is proportional coefficient and B is offset value.

The subtracting circuit 45 is coupled to the output terminal of the output feedback circuit 402A to receive the feedback voltage signal VFBL, subtracts a preset constant VCONST from the feedback voltage signal VFBL, and generates an output signal VCOMP1, and VCOMP1=VFBL−VCONST. The selection circuit 46 may comprise switch elements that are employed to add or remove components to change equivalent output values. In one embodiment, the selection circuit 46 has a first input terminal, a second input terminal, a control terminal and an output terminal, wherein the first input terminal is coupled to the output terminal of the ADC 44 to receive an analog output signal VCOMP2, the second input terminal is coupled to the output terminal of the subtracting circuit 45. The selection circuit 46, based on the mode control signal MS, selects one of the output signal VCOMP1 of the subtracting circuit 45 and the analog output signal VCOMP2 of the DAC 42 as the output feedback signal VCOMP at the output terminal. Wherein when the mode control signal MS has the first level, the output signal VCOMP1 of the subtracting circuit 45 is selected as the output feedback signal VCOMP. When the mode control signal MS has the second level, the analog output signal VCOMP2 of the DAC 42 is selected as the output feedback signal VCOMP. Based on the output feedback signal VCOMP, the control circuit 404A generates control signal VG1 and VG2 to control the switches HS and LS of the switching circuit 401A.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A test method of a voltage regulator, wherein the voltage regulator has a plurality of parameters that need to be set, the test method comprising:
  on a computer, receiving a user requirement for the voltage regulator;
  receiving a first subset of the plurality of parameters, wherein the first subset comprises a first parameter range and a second parameter range;
  calculating a second subset of the plurality of parameters based on a preset relational data model and the first subset, wherein the second subset comprises a third parameter range and a fourth parameter range;

combining the first subset and second subset to generate a plurality of setting combinations of the plurality of parameters, wherein the plurality of parameters has different combination of values in different setting combinations;

downloading the plurality of setting combinations to the voltage regulator via a first input/output (I/O) bus and configuring the voltage regulator with each setting combination;

configuring communication between a controller provided by the computer and measurement devices coupled to the voltage regulator to meet the user requirement;

executing the communication between the controller and the measurement devices via a second I/O bus; and displaying test result of each configured voltage regulator on the computer.

2. The test method of claim 1, further comprises:

receiving the first parameter range and the second parameter range from a graphical user interface (GUI);

setting step of each of the plurality of parameters in the GUI; and displaying the third parameter range and the fourth parameter range in the GUI after calculation.

3. The test method of claim 1, wherein downloading the plurality of setting combinations to the voltage regulator comprises:

downloading the plurality of setting combinations in an interface circuit of the voltage regulator.

4. The test method of claim 1, wherein configuring the voltage regulator with each setting combination comprises:

setting the plurality of parameters of the voltage regulator in accordance with the combination of values of each setting combination.

5. The test method of claim 1, wherein configuring the communication between the controller and the measurement devices comprises:

calling communication function of a driver module in accordance with the user requirement; and generating control instructions to operate the measurement devices in accordance with the communication function of the driver module.

6. The test method of claim 5, wherein a module for calling the communication function has a different computer program than the driver module.

7. The test method of claim 5, wherein executing the communication between the controller and the measurement devices comprises:

sending the control instructions from the driver module to the measurement devices; and receiving test result of the each configured voltage regulator in the controller while operating the measurement devices in accordance with the control instructions.

8. The test method of claim 1, wherein the user requirement comprises changing an input voltage of voltage regulator within a specified range.

9. The test method of claim 1, wherein displaying the test result comprises displaying performance curves of configured voltage regulator in a chart.

10. A test system for a voltage regulator, wherein the voltage regulator has a plurality of parameters that need to be set, the test system comprising:

a computer comprising a memory, a main module and a processor configured to execute computer-readable program code in the memory, the computer that receives a user requirement, and the main module receives a first subset of the plurality of parameters, calculates a second subset of the plurality of parameters based on a preset relational data model and the first subset, and combines the first subset and second subset to generate a plurality of setting combinations of the plurality of parameters, wherein the plurality of parameters has different combination of values in different setting combinations;

the voltage regulator, the voltage regulator downloads the plurality of setting combinations via a first I/O bus coupled to the computer for configuring the voltage regulator with each setting combination;

measurement devices coupled to the voltage regulator, the measurement devices communicate with a controller provided by the computer via a second I/O bus; and wherein the controller sends control instructions to operate the measurement devices, receives and displays test result of each configured voltage regulator while operating the measurement devices in accordance with the control instructions.

11. The test system of claim 10, wherein the main module further comprises:

a first GUI element that receives the first subset comprising a first parameter range and a second parameter range;

a second GUI element configured to set step of each of the plurality of parameters; and a third GUI element that displays the second subset comprising a third parameter range and a fourth parameter range after calculation.

12. The test system of claim 10, wherein:

the main module calls communication function of a driver module in the computer in accordance with the user requirement; and the driver module generates the control instructions to operate the measurement devices in accordance with the communication function of the driver module.

13. The test system of claim 12, wherein the main module has a different computer program than the driver module.

14. The test system of claim 13, wherein the computer program of the driver module comprises LabVIEW.

15. The test system of claim 10, the voltage regulator comprises:

an interface circuit that receives the plurality of setting combinations, and sets the plurality of parameters of the voltage regulator in accordance with the combination of values of each setting combination.

16. The test system of claim 10, wherein the user requirement comprises changing a load of the voltage regulator from no-load to full-load with a specified step.

17. The test system of claim 10, wherein the computer displays performance curves of configured voltage regulator in a chart.

18. The test system of claim 17, wherein the computer provides the corresponding values of the plurality of parameters while identifying an optimum performance curve in the chart.

* * * * *